United States Patent
Hartman et al.

(10) Patent No.: US 7,024,589 B2
(45) Date of Patent: Apr. 4, 2006

(54) REDUCING THE COMPLEXITY OF FINITE STATE MACHINE TEST GENERATION USING COMBINATORIAL DESIGNS

(75) Inventors: Alan Hartman, Haifa (IL); Andrei Kirshin, Haifa (IL); Kenneth Nagin, Nazareth Ilit (IL); Sergey Olvovsky, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 752 days.

(21) Appl. No.: 10/173,453

(22) Filed: Jun. 14, 2002

(65) Prior Publication Data

US 2003/0233600 A1 Dec. 18, 2003

(51) Int. Cl.
*G06F 11/00* (2006.01)

(52) U.S. Cl. .......................... 714/32; 714/739
(58) Field of Classification Search ............... 714/32, 714/33, 26, 27, 739, 734, 742, 37, 38; 717/104, 717/124, 131, 141, 151
See application file for complete search history.

(56) References Cited

U.S. PATENT DOCUMENTS

| | | | | |
|---|---|---|---|---|
| 5,500,941 A | * | 3/1996 | Gil ............................... | 714/38 |
| 5,542,043 A | * | 7/1996 | Cohen et al. .................. | 714/32 |
| 5,870,539 A | * | 2/1999 | Schaffer ....................... | 714/38 |
| 5,918,037 A | * | 6/1999 | Tremblay et al. .............. | 716/2 |
| 6,038,378 A | * | 3/2000 | Kita et al. ..................... | 714/38 |
| 6,059,837 A | * | 5/2000 | Kukula et al. ................. | 703/27 |
| 6,487,704 B1 | * | 11/2002 | McNamara et al. ........... | 716/5 |
| 2003/0046609 A1 | * | 3/2003 | Farchi et al. .................. | 714/30 |
| 2003/0046613 A1 | * | 3/2003 | Farchi et al. .................. | 714/38 |
| 2003/0208351 A1 | * | 11/2003 | Hartman et al. ............... | 703/22 |
| 2004/0078674 A1 | * | 4/2004 | Raimi et al. ................... | 714/33 |

OTHER PUBLICATIONS

A.W. Williams, "Determination of Test Configurations for Pair–Wise Interaction Coverage," *School of Information Technology, Univ of Ottawa, Canada*, pp. 57–72.

D.T. Tang, L.S. Woo, "Exhaustive Test Pattern Generation with Constant Weight Vectors," *IEEE Transactions on Computers*, vol. C–32, No. 12, Dec. 1983, pp. 1145–1150.

S. Gal, "Rendezvous Search on the Line," *Dept. of Statistics, Haifa Univ., Israel*, Apr. 1998, pp. 974–976.

S.Y. Boroday, "Determining Essential Arguments of Boolean Functions. A Draft Translation," 3 pages.

N.J.A. Sloane, "Covering Arrays and Intersecting Codes," *Mathematical Sciences Research Center, AT&T Bell Laboratories, New Jersey*, Jan. 25, 1994, 18 pages.

(Continued)

*Primary Examiner*—Nadeem Iqbal
(74) *Attorney, Agent, or Firm*—Stephen C. Kaufman

(57) ABSTRACT

A design verification system generates a small set of test cases, from a finite state machine model of the application under test. The finite state machine is reduced by creating efficient samples of the inputs to the application under test which are prepared by combinatorial input parameter selection. The test cases are generated by finite state machine traversal of the reduced state machine, and tests interacting combinations of input parameters in an efficient way. The technique is integrated into a test generator based on a finite state machine. Using an extended language, partial rulesets are employed to instruct the test generator to automatically employ combinatorial input parameter selection during test generation. Another technique for test case generation is disclosed, which uses combinatorial selection algorithms to guarantee coverage of the system under test from the aspect of interaction between stimuli at different stages or transitions in the test case.

28 Claims, 3 Drawing Sheets

OTHER PUBLICATIONS

S.Y. Borodai, I.S. Grunskii, "Recursive Generation of Locally Complete Tests," *1993 Plenum Publishing Corporation, 1060–0396/92/2804*, pp. 504–508.

G. Seroussi, N.H. Bshouty, "Vector Sets for Exhaustive Testing of Logic Circuits," *IEEE Transactions on Information Theory*, vol. 34, No. 3, May 1988, pp. 513–522.

D.T. Tang, C.L. Chen, "Iterative Exhaustive Pattern Generation for Logic Testing," *IBM J. Res. Develop.*, vol. 28, No. 2, Mar. 1984, pp. 212–219.

Y. Lei (Fujitsu), K.C. Tai (No. Carolina State Univ.), "In–Parameter–Order: A Test Generation Strategy for Pairwise Testing," *IEEE 1998*, pp. 254–261.

M.A. Chateauneuf, C.J. Colbourn, D.L. Kreher, "Covering arrays of strength three," pp. 1–8.

D.M. Cohen, S.R. Dalal, M.L. Fredman, G.C. Patton, "The AETG System: An Approach to Testing Based on Combinatorial Design," http://www.argreenhouse.com/papers/gcp/AETGieee97.shtml, 1997, 17 pages.

M. Chateauneuf (Univ. of Waterloo, Ontario), D.L. Kreher (Michigan Technological Univ.), Michigan), "On the state of strength–three covering arrays," 2000, pp. 1–22.

* cited by examiner

REDUCING THE COMPLEXITY OF FINITE STATE MACHINE TEST GENERATION USING COMBINATORIAL DESIGNS

BACKGROUND OF THE INVENTION

1. Field of the Invention

This invention relates to software testing. More particularly this invention relates to improvements in the sampling of an input space during generation of test programs for a software implementation that has been modeled as a finite state machine.

2. Description of the Related Art

In the field of hardware testing, it is common to treat the device under test as a finite state machine (FSM). It has been proposed to similarly automate software testing by representing the software program as a finite state machine, in which transitions are represented as directed edges between states. However, the number of tests required to exhaustively exercise a software program is typically much larger than is required for hardware. Furthermore resources for test execution are limited, and their use constitutes a cost. Accordingly, test engineers have attempted to reduce the number of tests selectively, in order that the test generation process be practical in terms of cost and execution time, recognizing that the testing process must still be reliable. Explosion of the number of test programs that are generated by automatic techniques is a drawback of automatic test program generation.

During the past decade, model-based random test program generators have become popular in processor architectural design verification and software testing. Model-based test generation involves the generation of a suite of tests from an abstract model of an application's behavior. The model is derived from a specification of the application. In many model-based testing situations, the behavioral models are described as finite state machines. Such models describe the possible states of the application and the transitions from state to state caused by operations or stimuli. Test suites generated from these behavior models cover different operation invocation patterns according to the testing goals.

Test engineers use finite state machines to model externally observable behavior, and then use various tools to traverse paths of test actions that connect a sequence of states. They then generate test cases for a variety of purposes, for example, acceptance suites, full functional test suites, and regression test suites. Regression test suites involve a rerun of selected portions of a test suite following a revision of an application.

Because a finite state machine that reflects the specification of a useful software program is typically very large, various approaches have been taken to manage the model, using concise and powerful graphical and textual languages. Various traversal algorithms are applied to the finite state machine for test generation. These algorithms are parameterized by the test engineer at runtime.

The generation of an astronomical number of possible test cases is a well-known software testing problem, which has been exacerbated by the speed of automated test generation. Test engineers deal with this by identifying "equivalence classes" for various attributes of test cases. For example, for a function call argument that must fall within the range of 1 to 5, a test engineer may decide to test the minimum value 1, the maximum value 5, and one value that falls between the minimum and the maximum, such as the value 2. With these decisions, the test engineer places the values 2, 3, and 4 in an "equivalence class". Each value is considered equivalent to the other two, in the sense that if the test fails for any value in the class, then it will fail for all other values of the class. The recognition of equivalence classes stems from the recognition of inherent properties of the software being tested. In theory, there is one "true" set of equivalence classes for a particular program. Once these classes are correctly ascertained, they will remain static throughout the testing period, or until the software application under test is significantly changed.

Conventional approaches to test generation have common problems that the present invention builds upon. In each case, the number of unique paths, or generated test programs is an exponential function of the number of modeled states and transitions. Thus as the scope of the modeled behavior grows, the time to exhaustively generate test cases, and more significantly, the time needed to execute the generated test cases grows exponentially. This growth places a practical limit on the complexity of the program behavior to which automated test generation can be applied. The invention focuses on the model of the software, and therefore reduces the number of tests to a practical level. In so doing, the invention raises the practical limit on the complexity of the software program to which automated test generation may be applied.

For example, a standard approach to the generation of a test suite for a Java™ class, or any other applications programming interface (API), is to model each of the method calls or interface calls as a transition in a finite state machine (FSM). A particular method may have n parameters, each over an input domain. If each of the input domains is binary, there are $2^n$ possible inputs to the method. Even if the input domain is integer or real, common practice requires testing with five or six different values. Common testing abstractions for very large domains include a minimum value, a maximum value, one or two randomly chosen values, and a value outside the domain. Typically, a model of this interface will have $5^n$ possible test inputs. If, in addition there are several methods that interact, the space of interesting test cases is vast.

A common test planning heuristic is "suspicion testing", in which "suspected" features of the program are evaluated. For example, aspects of the program that are inherently difficult to implement are suspected to have a relatively high probability of containing defects.

In other approaches, constraints have been imposed on paths or transitions, and if not satisfied, the path would not be tested further.

Typical of prior art approaches for generating test programs is U.S. Pat. No. 5,394,347 to Kita et al. which discloses a method of modeling a specification as an extended finite state machine, then performing a depth-first traversal of the resulting state diagram to generate a path file as a basis for a test program.

U.S. Pat. No. 5,623,499 to Ko et al. discloses a technique for generating a test data sequence of minimal length, employing an extended finite state machine. This technique attempts to balance the number of traversals of the directed edges in order to test values in a predetermined test data set. The test data sequence is constructed using an Euler tour.

In U.S. Pat. No. 5,918,037 to Tremblay et al., it is proposed to employ a test generator that automatically produces test programs based on a finite state machine model of the software. Limiting the number of test programs is achieved by controlling loop execution, and by appropriately setting the coverage level for the model, known as "transition cover testing". This approach seeks to specify during the test program generation process that each transition within the finite state machine model be exercised once. The generator is capable of specifying different coverage levels for selected portions of the program under test, so that critical portions might be exhaustively tested, while other portions receive less comprehensive testing.

Another model-based generator is the GOTCHA-TCBeans Software Test Tool Kit, which has been developed by International Business Machines Corporation, New Orchard Road, Armonk, N.Y. 10504. This tool provides a framework designed to assist testers in developing, executing and organizing function tests directed against Application Program Interfaces (APIs) and software protocols written in Java, C or C++.

Attempts have been made to reduce the number of test cases in general software testing systems using combinatorics. U.S. Pat. No. 5,542,043 proposes generating a minimum number of test cases by defining tables that contain related field values, and then generating a corresponding table of test cases. The algorithms employed for the tables are capable of producing a minimal number of test cases in which elements interact in any given degree.

An approach for minimizing the cost of software testing was put forward in the document *The AETG System: An Approach to Testing Based on Combinatorial Design*. Cohen, D. M., Dalal, S. R., Fredman, M. L., and Patton, G. C. IEEE Transaction on Software Engineering. Volume 23, Number 27, July 1997. This document discloses using test suites generated from combinatorial designs. This approach involves identifying parameters that define the space of possible test scenarios, than selecting test scenarios in such a way as to cover all the pairwise (or t-wise) interactions between these parameters and their values.

A similar approach was disclosed earlier for hardware testing in the document *Iterative Exhaustive Pattern Generation for Logic Testing*, D. T. Tang and C. L. Chen, IBM J. Res. Develop 28 (1984), 212–219, and the document *Exhaustive Test Pattern Generation with Constant Weight Vectors*, D. T. Tang and L. S. Woo. IEEE Trans. Computers 32 (1983) 1145–1150. This approach is familiar to statisticians, and has been used in the design of agricultural experiments since the 1940's. The statistical analysis of such experiments is facilitated if every interaction is covered the same number of times. However, the above-noted Cohen et. al. document points out that in the testing of software it is often sufficient to generate test suites such that each interaction is covered at least once.

SUMMARY OF THE INVENTION

It is a primary advantage of some aspects of the present invention that comprehensive test suites can be efficiently generated using finite state machines, with guaranteed test coverage for both the inputs and the interactions between stimuli of different types.

It is another advantage of some aspects of the present invention that the size of a finite state machine for testing a design is considerably reduced.

These and other advantages of the present invention are attained by the use of combinatorial designs to provide efficient sampling of the input space during test generation, while guaranteeing coverage of the input space. According to the invention, the integration of combinatorial input parameter selection, together with finite state machine traversal creates finite state machine models with small behavior spaces, but which still test all combinations of input parameters in an efficient way. The technique is integrated into a test generator based on a finite state machine. The technique provides a powerful tool for test engineers who are responsible for the generation of comprehensive test suites. Using an extended language, partial rulesets are employed to instruct the test generator to automatically employ combinatorial input parameter selection during test generation.

The invention provides a method of verifying a design, including the steps of modeling the behavior of the design as a finite state machine, generating a test program based on the finite state machine, and preparing a suite of test cases as an input for the test program. The test cases include at least one command, having a plurality of parameters. The parameters have a predetermined level of mutual interactions. The test cases are reduced in number to a near-optimal minimal plurality that is required to include at least one instance of each of the mutual interactions at the predetermined level.

In an aspect of the method, the suite of test cases is prepared by defining relationships among the parameters as a plurality of t-tuples of values of the parameters, and preparing a table of input sets. The table has a plurality of columns, each of the columns including a portion of the values. The method includes finding a partial test case including a set of t columns, in which the deficiency of missing t-tuples is maximal, assigning one of the missing t-tuples as the values for the set of t columns, entering possible values of the missing t-tuples in the other columns, ranking the other columns and the possible values according to a reduction of the deficiency that is produced by inclusion in the partial test case of respective ones of the other columns, and selecting one of the other columns and the values thereof ranking highest, and including the selection in the input set.

In a further aspect of the method, finding and selecting are performed repetitively.

In yet another aspect of the method, ranking includes entering a value x in a ranked column, computing a value $p_0$ that represents an immediate decrease of the deficiency, and computing a sequence of values $p_1, p_2, \ldots, p_i, \ldots, p_{t-1}$ that represents a potential number of the missing t-tuples having the value x in the ranked column, and i undecided values in the other columns.

In one aspect of the method, the suite of test cases is prepared by defining relationships among the parameters, preparing tables of input sets, each of the tables of input sets corresponding to one of the relationships, and combining the tables of input sets into a single table of test cases.

In a further aspect of the method, the suite of test cases is prepared by including the tables of input sets in corresponding partial rulesets.

According to yet another aspect of the method, at least one of the partial rulesets is a table driven ruleset.

According to still another aspect of the method, at least one of the partial rulesets is an input coverage ruleset.

According to an additional aspect of the method, at least one of the partial rulesets is an input pair coverage ruleset.

According to one aspect of the method, at least one of the tables of input sets is included by reference in the partial rulesets.

According to one aspect of the method, the suite of test cases includes a predetermined number of invocations of a rule of each of the partial rulesets at each transition position of at least one of the test cases.

According to another aspect of the method, the suite of test cases includes a predetermined number of invocations of rules of each pair of the partial rulesets at each transition position of at least one of the test cases.

According to still another aspect of the method, the partial rulesets comprise an input table and rules having declared variables, wherein the input table includes values of the variables and a special character that represents all legal values of a corresponding one of the variables.

According to another aspect of the method, the level of mutual interactions is 2-wise.

According to another aspect of the method, the level of mutual interactions is at least 3-wise.

The invention provides a computer software product, including a computer-readable medium in which computer program instructions are stored, which instructions, when read by a computer, cause the computer to execute a method of verifying a design, including loading a behavior model of the design as a finite state machine, generating a test program based on the finite state machine, and preparing a sample of all possible inputs for the test program, wherein the sample comprises a list of parameters. The parameters have predetermined mutual interactions, wherein the sample is minimized to a near-optimal minimal plurality of the inputs that is required to cover at least one instance of each the interactions.

The invention provides a verification system, including a memory that stores a behavioral model of a design as a finite state machine. The system includes a test generator for generating a test program according to the behavioral model. The test generator is adapted to prepare a set of sample inputs for the test program, wherein the inputs comprise a plurality of parameters. The parameters have a predetermined level of mutual interactions. The set has substantially a minimal plurality of the inputs that are required to include at least one instance of each of the interactions in a test.

An aspect of the verification system includes an execution engine for executing the test program on a system-under-test, and a validation engine for evaluating the response of the system-under-test to the test program.

The invention provides a method of testing a design, including the steps of defining a finite state machine as a behavior model of a system-under-test having transitions between states thereof, providing a partial ruleset including a rule and a parameter list, and providing an input table having at least one set of parameters corresponding to members of the parameter list. Responsive to the partial ruleset, the method includes generating a test program for the system-under-test, wherein the rule of the partial ruleset is invoked at one of the transitions of the finite state machine using the set of parameters in the parameter list.

The invention provides a computer software product, including a computer-readable medium in which computer program instructions are stored, which instructions, when read by the computer, cause the computer to execute a method of testing a design, including defining a finite state machine as a behavior model of a system-under-test, providing a partial ruleset including a rule and a parameter list in the partial ruleset. An input table has at least one set of parameters corresponding to members of the parameter list, and responsive to the partial ruleset, a test program is generated for the system-under-test, wherein the rule of the partial ruleset is invoked at one of the transitions of the finite state machine using the set of parameters in the parameter list.

The invention provides a verification system, including a memory in which is stored a behavioral model of a system-under-test as a finite state machine. The system includes a test program generator that is responsive to the behavioral model for generating a test program for the system-under-test. The test program generator is adapted to a programming language including a partial ruleset having a rule, a parameter list in the rule, and an input table, which has at least one input set of parameters corresponding to the parameter list. In the test program, the rule is invoked at one of the transitions of the finite state machine, using the input set of parameters.

BRIEF DESCRIPTION OF THE DRAWINGS

For a better understanding of these and other objects of the present invention, reference is made to the detailed description of the invention, by way of example, which is to be read in conjunction with the following drawings, wherein.

DETAILED DESCRIPTION OF THE INVENTION

In the following description, numerous specific details are set forth in order to provide a thorough understanding of the present invention. It will be apparent to one skilled in the art, however, that the present invention may be practiced without these specific details. In other instances well-known circuits, control logic, and the details of computer program instructions for conventional algorithms and processes have not been shown in detail in order not to unnecessarily obscure the present invention.

Software programming code, which embodies aspects of the present invention, is typically maintained in permanent storage, such as a computer readable medium. In a client/server environment, such software programming code may be stored on a client or a server. The software programming code may be embodied on any of a variety of known media for use with a data processing system, such as a diskette, or hard drive, or CD-ROM. The code may be distributed on such media, or may be distributed to users from the memory or storage of one computer system over a network of some type to other computer systems for use by users of such other systems. The techniques and methods for embodying software program code on physical media and distributing software code via networks are well-known and will not be further discussed herein.

Architectural Overview

Figure 1:
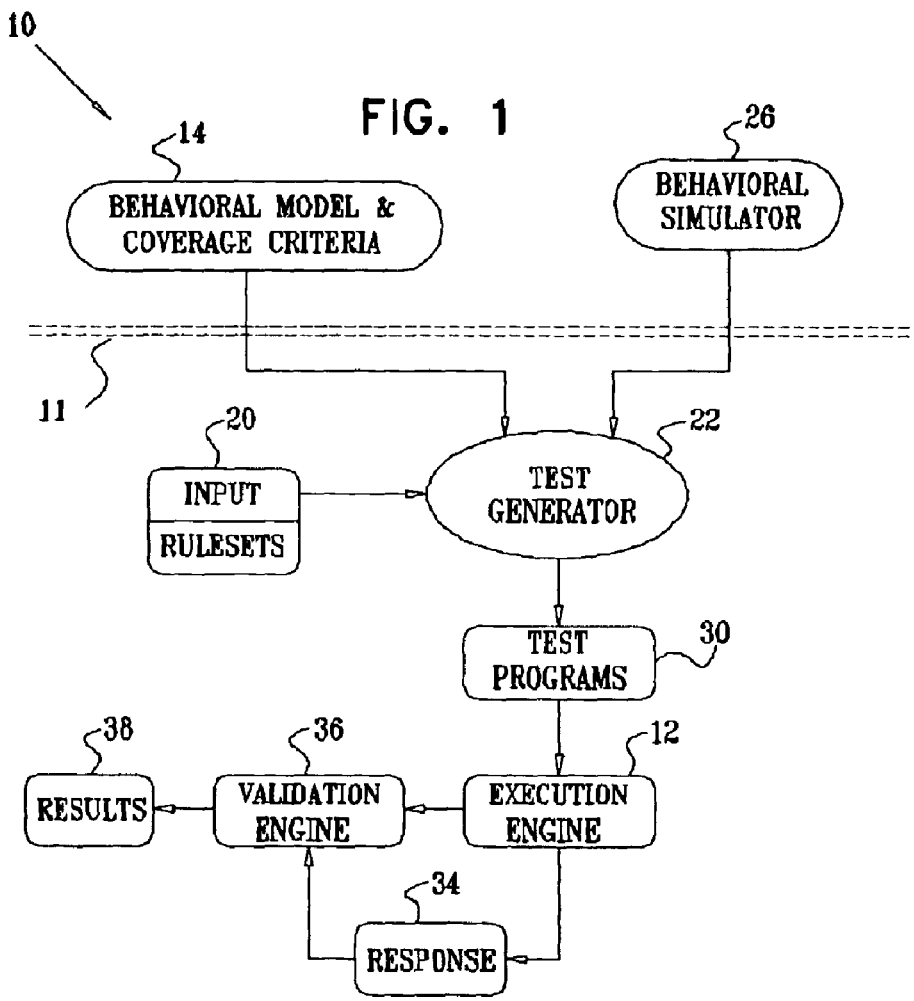
FIG. 1 is a block diagram of a verification system that is operable in accordance with a preferred embodiment of the invention.

Turning now to the drawings, reference is made to FIG. 1, which is a block diagram of a verification system 10 that is operable in accordance with a preferred embodiment of the invention. The teachings of the present invention are not restricted to systems that are configured as the verification system 10, but are applicable to many testing systems that have different architectures than the verification system 10, but nevertheless employ finite state machines and require a suite of test cases to be generated.

The verification system 10, used for verifying a software or hardware implementation, has several basic interacting components. Those components of the verification system 10 that are located above a broken line 11 are dependent on the specification of the implementation being verified, while those located below the line 11 are independent of the specification.

The verification system 10 enables the creation of tests that have various degrees of randomness. The ability of the verification system 10 to introduce random unspecified values is generally desirable, since design flaws in practice are usually unpredictable.

An abstract behavioral model 14 holds a formal description of the specification of the system. This specification may be stored in a database, which may also incorporate testing knowledge of the system design, and may include testing constraints and coverage criteria. The integration of all the information stored in the behavioral model 14 is regarded as a knowledge base of the verification system 10. Typically, the behavioral model 14 is realized as a finite state machine that is stored in a memory as a data object. A part of the behavioral model includes modeling the inputs to the system under test, sometimes referred to as modeling the environment. The inputs to the system being modeled are implemented in the well-known Murphi modeling language and modeled by a construct called a ruleset. In general, the set of all possible inputs that may arrive from the environment to the system under test is the Cartesian product of all possible values of all parameters.

A generic test program generator engine 22 has a user input 20, which influences the algorithms used to generate test cases and the algorithms used to enumerate the space of possible execution paths of the system under test.

A behavioral simulator 26 can be used to develop the behavioral model 14, and to predict the results of instruction execution in accordance with the specification of the system being verified. It is possible to employ the techniques of the invention in verification systems that do not employ a behavioral simulator.

The test program generator engine 22 may also receive some generic knowledge of the design specification, and can exploit this knowledge so as to generate sequences of instructions to form the test programs 30. The test programs 30 are executed by an execution engine 12 on an implementation of the system under test. The system can be a complex software implemented system, for example middleware, or a hardware simulator. Indeed, the system itself may be a simulator.

Execution of the test programs 30 produces a response 34 from the system. The response 34 is typically submitted to a validation process, represented in FIG. 1 as a validation engine 36, which has knowledge of the expected response, validates the response 34, and produces validation results 38.

Test Programs

Continuing to refer to FIG. 1, the teachings of the present invention are now explained with reference to an exemplary test situation.

EXAMPLE 1

In this example, the test programs 30 are generated for purpose of testing an interface having three commands, with which the execution engine 12 stimulates a system-under-test:

stimulus 1: InsertObject(parm1, parm2, parm3, parm4), where each of the four parameters can take values from the set {1,2,3};

stimulus 2: ModifyObject(parm5, parm6, parm7), where the parameters parm5, parm6, and parm7 are Boolean variables; and stimulus 3: ExtendObject(parm8, parm9, parm10), where the parameters parm8 and parm9 are over the range {1,2,3} and the parameter parm10 is a Boolean variable.

There are 81 possible input sets to stimulus 1, eight possible input sets to stimulus 2, and 18 possible input sets to stimulus 3. Thus, at any given state of the test, there are 81+8+18=107 distinct stimuli. In this test situation, the number of possible test cases for the three stimuli, applied in any sequence, is $107^3$=1,225,043 test cases. The finite state machine thus realized in the behavioral model 14 would be impracticably large. This test situation, although a relatively small example, illustrates the explosion of the input space of possible test cases.

It has been discovered by the inventors that combinatorial designs can be employed to select a subset of the input sets to achieve t-wise coverage of the input space for some fixed value of t (usually t=2). Then, conventional finite state machine coverage algorithms can be applied to this reduced state space to produce a practical test suite. Suitable algorithms are disclosed in commonly assigned copending application Ser. No. 09/847,309 entitled "Technique Using Persistent Foci For Finite State Machine Based Software Test Generation", which is herein incorporated by reference.

Figure 2:
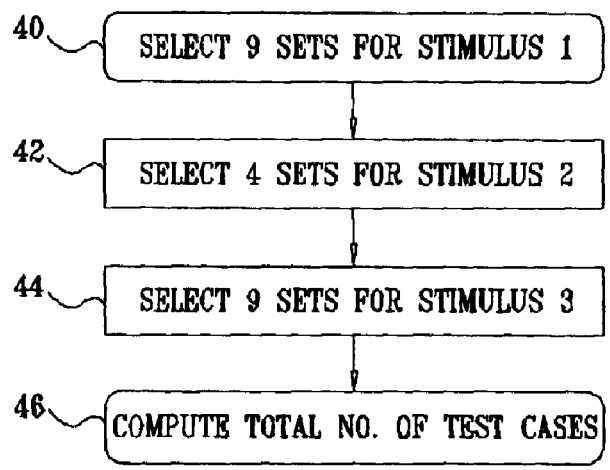
FIG. 2 is a flow chart illustrating the application of pair-wise test coverage in accordance with a preferred embodiment of the invention.

Reference is now made to FIG. 2, which is a flow chart illustrating the application of 2-wise (pair-wise) coverage to the above stimuli. FIG. 2 is disclosed with reference to Example 1, wherein parameters are selected as follows. In initial step 40 nine input sets are selected for stimulus 1 such that all pairs of input values appear together at least once in the selected sets.

Preferably the selection is accomplished by preparing a table of test cases for each relationship between parameters, and then combining the tables into a single table of test cases. It is satisfactory to use the combinatorial algorithms described in the above-noted U.S. Pat. No. 5,542,043, which is herein incorporated by reference, in order to select a minimal plurality of test cases in which each t-wise interaction of parameters is represented at least once. A suitable suite of input sets for stimulus 1 is shown in Listing 1.

Listing 1

InsertObject(1 1 1 1)
InsertObject(1 2 2 2)
InsertObject(1 3 3 3)
InsertObject(2 1 2 3)
InsertObject(2 2 3 1)
InsertObject(2 3 1 2)
InsertObject(3 1 3 2)
InsertObject(3 2 1 3)
InsertObject(3 3 2 1)

The example of Listing 1 may be produced, for example, by the projective plane algorithm described in the above-noted U.S. Pat. No. 5,542,043 and in the above-noted A. W. Williams publication, *Determination of Test Configurations for Pair-Wise Interaction Coverage*.

Inspection of Listing 1 confirms that every possible pair of input values occur together in at least one of the selected input sets.

Next, at step 42 four input sets are similarly selected for stimulus 2, as shown in Listing 2.

Listing 2

ModifyObject(F F F)
ModifyObject(F T T)

ModifyObject(T F T)
ModifyObject(T T F)

The example of Listing 2 can be produced by the above-noted projective plane algorithm.

This choice of input sets guarantees that every possible pair of input values occur together in at least one of the selected input sets, as is evident by inspection of Listing 2.

Next, at step 44, nine input sets are similarly selected for stimulus 3, as shown in Listing 3.

Listing 3

ExtendObject(1 1 T)
ExtendObject(1 2 T)
ExtendObject(1 3 F)
ExtendObject(2 1 F)
ExtendObject(2 2 T)
ExtendObject(2 3 F)
ExtendObject(3 1 T)
ExtendObject(3 2 F)
ExtendObject(3 3 T)

The example of Listing 3 can be produced by a combination of any of the deterministic algorithms disclosed in the above-noted U.S. Pat. No. 5,542,043, and a heuristic process, such as the one described in the heuristics section hereinbelow.

As in the case of Listing 2, this choice guarantees that every possible pair of input values occur together in at least one of the selected input sets, as is evident by inspection of Listing 3.

In final step 46 the total number of test cases is determined. As there are 9+4+9=22 distinct input sets in a sequence of 3 stimuli, it is determined that there are a total of $22^3$=10648 test cases. Thus, the resulting final state machine embodied in the behavioral model 14 (FIG. 1) has been considerably reduced in size.

The above technique is efficient in lowering the complexity of finite state machine traversal. In a situation in which the largest input space has n parameters which can take on at most k values, the technique reduces the number of transitions from $O(k^n)$ to $O(k^t \log n)$ for any fixed value of n.

The following disclosure will facilitate the understanding of the present invention.

Covering Suites

Let $D_1, D_2, \ldots, D_k$ be finite sets of cardinalities $n_1, n_2, \ldots, n_k$ respectively. A test suite with N test vectors is an array $A=(a_{ij}: 1 \leq i \leq N, 1 \leq j \leq k)$ where each member of the array $a_{ij} \in D_j$ for all i, and j. The rows of the array are called test vectors. The test suite A is said to be a t-wise covering suite with parameters $n_1, n_2, \ldots, n_k$ if for any t distinct columns $C_1, c_2, \ldots, c_t$ and for any ordered t-tuple $T \in D_{c_1} \times D_{c_2} \times \ldots \times D_{c_t}$ there exists at least one row r such that $a_{rc_1}, a_{rc_2}, \ldots, a_{rc_t}$=T.

The integer $CS_t(n_1, n_2, \ldots, n_k)$ is defined to be the minimum integer N such that there exists a t-wise covering suite with N test cases for k domains of sizes $n_1, n_2, \ldots, n_k$. The function is well defined, since the actual members of the sets $D_j$ are not important; what really matters is the cardinalities of the sets. Unless otherwise stated, it is assumed that $D_j=\{0, 1, \ldots, n_j-1\}$.

If all the domains are the same size, say n, $CS_t(n, n, \ldots, n)$ is denoted by $CS_t(n^k)$.

It is clear from the definition that $CS_0(n^k)=1$, and $CS_1(n^k)=n$.

In the rest of this section some elementary properties of covering suites and the covering suite numbers defined above are established.

Lemma 1: $CS_t(n_1, n_2, \ldots, n_k) \geq n_1 n_2 \ldots n_t$, and hence $n^k \geq CS_t(n^k) \geq n^t$ It is now shown that $CS_t(n^k)$ is a non-decreasing function of t, n and k.

Lemma 2: For all positive integers s, t, n, m, l, and k
a) if k<l then $CS_t(n^k) \leq CS_t(n^l)$
b) if $n_i \leq m_i$ for all i then $CS_t(n_1, n_2, \ldots, n_k) \leq CS_t(m_1, m_2, \ldots, m_k)$ and in particular c) if n<m then $CS_t(n^k) \leq CS_t(m^k)$
d) if S<t then $CS_s(n^k) < CS_t(n^k)$.

The problem of minimizing the number N of test cases in a t-wise covering test suite for k domains of size n was apparently first disclosed in the publication A. R□nyi, *Foundations of Probability*. Wiley, New York, 1971, and many papers on the subject have appeared since then. Many of the writers on the subject consider the mathematically equivalent problem of maximizing the number k of domains of size n in a t-wise covering test suite with a fixed number N of test cases. This problem is known as the problem of finding the size of a largest family of t-independent n-partitions of a N-set. Another name used in the literature for a test suite is a t-subjective array.

Orthogonal Arrays

Orthogonal arrays are structures that have been used in the design of experiments for over fifty years. An orthogonal array of size N with k constraints, n levels, strength t, and index λ is an N×k array with entries from $I_n=\{0, 1, \ldots n-1\}$ with the property that: in every N×t submatrix, every 1×t row vector appears precisely $\lambda=N/n^t$ times.

A fundamental paper, K. A. Bush, *Orthogonal Arrays Of Index Unity*. Annals of Mathematical Statistics 23 (1952) 293–295 gave constructions for orthogonal arrays of index 1, and bounds on their parameters. It is clear that an orthogonal array of index 1 is a special case of a covering suite, since in a covering suite each 1×t row vector is required to appear at least once. Thus, an orthogonal array is always a minimal-covering suite.

Orthogonal arrays of strength 2 and index 1 have been especially well studied as they are equivalent to mutually orthogonal Latin squares of order n.

A Latin square of order n is a square array of side n with entries from the set $I_n$, with the property that every row and every column contains every member of the set precisely once. Two Latin squares of order n are said to be mutually orthogonal if for any ordered pair of elements X, y} $\in I_n^2$ there exists precisely one cell such that the first square has the value x in the cell, and the second square has the value y in that cell. Two mutually orthogonal Latin squares of order 3 are illustrated in Table 1.

TABLE 1

| 0 | 1 | 2 | 0 | 1 | 2 |
| 2 | 0 | 1 | 1 | 2 | 0 |
| 1 | 2 | 0 | 2 | 0 | 1 |

A set of k−2. Latin squares of order n, each of which are orthogonal to each other, can be put in one-to-one correspondence with an orthogonal array of size $n^2$ with k constraints, n levels, strength 2, and index 1 as follows. A row of the array is defined for each of the $n^2$ cells in the Latin squares. The first column of each row contains the row number of the cell, the second column contains the column number of the cell, and the j-th column (for j>2) contains the element in the cell of the $j-2^{nd}$ Latin square. This construction is illustrated in Table 2, using the two orthogonal Latin square of order 3 shown in Table 1 to build the following orthogonal array of size 9, with 4 constraints, 3 levels, strength 2, and index 1.

TABLE 2

```
0000
0111
0222
1021
1102
1210
2012
2120
2201
```

It is known, for example from the above-noted Bush publication, *The CRC Handbook of Combinatorial Designs*, C. J. Colbourn and J. H. Dinitz, CRC Press 1996, that there exists a set of n−1 mutually orthogonal Latin squares of order n if and only if there exists a finite projective plane of order n, and that moreover, the number of mutually orthogonal Latin squares of order n is at most n−1. This is summarized in the following result.

Theorem 1: $CS_2(n^k)=n^2$ for all $k \leq n+1$ if and only if there exists a projective plane of order n, and $CS_2(n^k)>n^2$ for all $k>n+1$.

It is also well known that projective planes exist for all orders $n=p^a$, which are powers of a single prime p. The construction of projective planes of prime power order was generalized in the above-noted Bush publication, which proved the following result.

Theorem 2: Let $n=p^a$ be a prime power with n>t. Then $CS_t(n^k)=n^t$ for all $k \leq n+1$. Moreover if $n \geq 4$ is a power of 2, then $CS_3(n^k)=n^3$ for all $k \leq n+2$.

In the construction for arrays of strength 2 one can order the rows so that the first grows have the form 0, x, x, . . . , x), one for every member x of the field. This is disclosed in further detail with reference to FIG. 4. Deleting these rows and the first column leaves an array with $q^2-q$ rows, and q columns having the property that any ordered pair of distinct members of the field is contained in some row of any pair of columns.

The above-noted Bush publication also discloses the following product construction, which generalizes a product construction for mutually orthogonal Latin squares.

Theorem 3: If there exist orthogonal arrays with k constraints, $n_i$ levels (for i=1,2), strength t, and index 1, then there exists an orthogonal array with k constraints, $n_1 n_2$ levels, strength t, and index 1.

The previous two theorems have the following consequences for covering suites:

Corollary 1: If $n=\Pi q_j$, where the $q_j$ are powers of distinct primes, then $CS_t(n^k)=n^t$, where k=1+max (t, min $q_j$).

A great deal of literature on the existence of sets of mutually orthogonal Latin squares is extensively listed in the above-noted publication, *The CRC Handbook of Combinatorial Designs*. These results all have implications for the sizes $CS_2(n^k)$ of optimal pairwise covering suites with $k \leq n+1$. Two of the most famous of these results are presented: the disproof of Euler's conjecture, and the Chowla, Erdős, Straus Theorem.

Theorem 4: For any positive integer n other than 2 or 6, there exists a pair of mutually orthogonal Latin squares of side n, and thus $CS_2(n^4)=n^2$ for all $n \notin \{2,6\}$.

Theorem 5: The number of mutually orthogonal Latin squares of side n goes to infinity with n, and for sufficiently large n, that number is at least $n^{0.0675}$.

Known Results and Lower Bounds.

The only case where tight lower bounds have been proved is when n=t=2. This result has been rediscovered several times.

Theorem 6: For all k>1, $CS_2(2^k)=N$ where N is the smallest integer such that $$k \leq \binom{N-1}{\lceil N/2 \rceil}$$

Table 3 gives exact values for the case $CS_2(2^k)=N$.

TABLE 3

| k | 2–3 | 4 | 5–10 | 11–15 | 16–35 | 36–56 | 57–126 |
|---|---|---|---|---|---|---|---|
| N | 4 | 5 | 6 | 7 | 8 | 9 | 10 |

The proof of these lower bounds uses Sperner's lemma when N is even and the Erdős-Ko-Rado theorem when N is odd.

The test suites that reach this bound may be constructed by taking the first test case to be the all 0 vector. The columns of the remaining N−1 rows each contain precisely $\lceil N/2 \rceil$ ones, and each column is constructed by choosing a different $\lceil N/2 \rceil$-subset of the rows.

For example when n=t=2 and k=15 it is deduced that N=7, and the optimal test suite is given in Table 8.

TABLE 4

```
00000 00000 00000
11111 11111 00000
11111 10000 11110
11100 01110 11101
10011 01101 11011
01010 11011 10111
00101 10111 01111
```

Constructions for Good, but Sub-Optimal Covering Suites.

The t-deficiency $D_t(A)$ of a test suite A with k domains of size n is defined to be the number of t-tuples of domain values not contained in any test case. Thus, the deficiency of a covering suite is 0, whereas the deficiency of an empty set of test cases is $$D(\phi) = \binom{k}{t} n^t.$$

The greedy algorithm for the construction of a covering suite is to start with the empty test suite, $A_0=\phi$, and at each stage to add a test case that decreases the deficiency by as much as possible. If $A_i$ is the test suite after the choice of i test cases, then it will be shown that $$D_t(A_i) \leq D_t(A_{i-1})(1-n^{-t}).$$

Thus $D_t(A_N) \leq D_t(\phi)(1-n^{-t})^N$. Let N be the smallest integer such that $D_t(A_N)<1$ then $N=\lceil -\log (D_t(\phi)/\log(1-n^{-t})\rceil$ if log $(1-n^{-t})$ by $-n^{-t}$ is approximated, it will be evident that $A_N$ is a covering suite when $$N \approx n^t \left( \log \binom{k}{t} + t \log n \right)$$

and hence:

Theorem 7: For all positive integers t, k, v:

$$CS_t(n^k) \leq \left( \log \binom{k}{t} + t \log n \right).$$

The major problem with this construction is that in order to compute the next test case to be selected, one must consider all $n^k$ possible test cases in order to choose one that decreases the deficiency as much as possible. In other words, it is not practical to implement this algorithm, since it would take too long to produce the result, and in any case, the resulting test suite would not necessarily be minimal.

Recursive Constructions

A recursive construction for a covering suite is a method for constructing a covering suite from one or more covering suites with smaller parameter sets. The process begins with an efficient recursive construction for pairwise covering suites. This construction is known from the publication A. W. Williams, *Determination of Test Configurations for Pair-Wise Interaction Coverage*, in Proceedings of the 13th International Conference on the Testing of Communicating Systems (TestCom 2000), Ottawa Canada, 2000, 59–74.

Theorem 8: If q is a prime power, and $CS_2(q^k) \leq N$ then $CS_2(q^{kq+1}) \leq N+q^2-q$.

Corollary 2: If q is prime power, and d is any positive integer, then $CS_2(q^{q^d+q^{d-1}+\ldots+q+1}) \leq dq^2-(d-1)q$.

Proof: The result follows from Theorem 2 when d=1, and by induction on d using Theorem 8.

This result implies a good constructive upper bound on the size of pairwise covering test suites.

Theorem 9: There is an absolute constant C such that $CS_2(n^k) \leq Cn^2 \log k$ for all positive integers k and n.

Proof: By Bertrand's postulate (proved by Chebyshev in 1851) there is a prime p, between n and 2n. In fact, for n>115, there is always a prime between n and 1.1n. Let d be the smallest integer such that $k \leq 1+p+p^2+\ldots+p^d$.

This implies that $1+p+p^2+\ldots+p^{d-1} < k$, and hence that $d = O(\log k)$. Now applying Corollary 1 and the monotonicity result, Lemma 2:

$$CS_2(n^k) \leq CS_2(p^{1+p+\ldots+p^d}) \leq dp^2 = O(n^2 \log k),$$

thus proving the theorem.

The construction given in the proof of Theorem 9 forms the base step of the algorithm in accordance with the invention for constructing pairwise covering suites. The base step is done using Theorem 2 or Corollary 1, followed by a recursive construction based on Theorem 9.

Another recursive construction, which has been rediscovered many times, is the following result. The result gives a method of squaring the number k of parameters in a covering suite of strength t, while multiplying the number of test cases by a factor dependent only on t and n, but independent of k. This factor is related to the Turan numbers T(t, n) that are defined to be the number of edges in the Turan graph. The Turan graph is the complete n-partite graph with t vertices, having b parts of size a+1, and n−b parts of size $a = \lfloor t/n \rfloor$ where b=t−na. Turan's theorem (1941) states that among all t-vertex graphs with no n+1 clique, the Turan graph is the one having the most edges.

When $n \geq t$, $T(t, n) = t(t-1)/2$, and that when n=2, then $T(t,2) = \lfloor t^2/4 \rfloor$.

Theorem 10: If $CS_t(n^k) = N$ and there exist T(t, n)−1 mutually orthogonal Latin squares of side k (or equivalently $CS_2(k^{T(t,n)+1}) = k^2$) then $CS_t(n^{k^2}) \leq N(T(t, n)+1)$ Before proving this result it may be noted that this generalizes the results given in the above-noted Tang and Chen publications, since they require k to be a prime. It generalizes and strengthens a result presented in the publication M. A. Chateauneuf, C. J. Colbourn, and D. L. Kreher, *Covering Arrays of Strength* 3, Designs, Codes, and Cryptography, 16 (1999) 235–242. This is done by removing the divisibility conditions on k, and producing smaller arrays in the cases where n<t.

Figure 3:
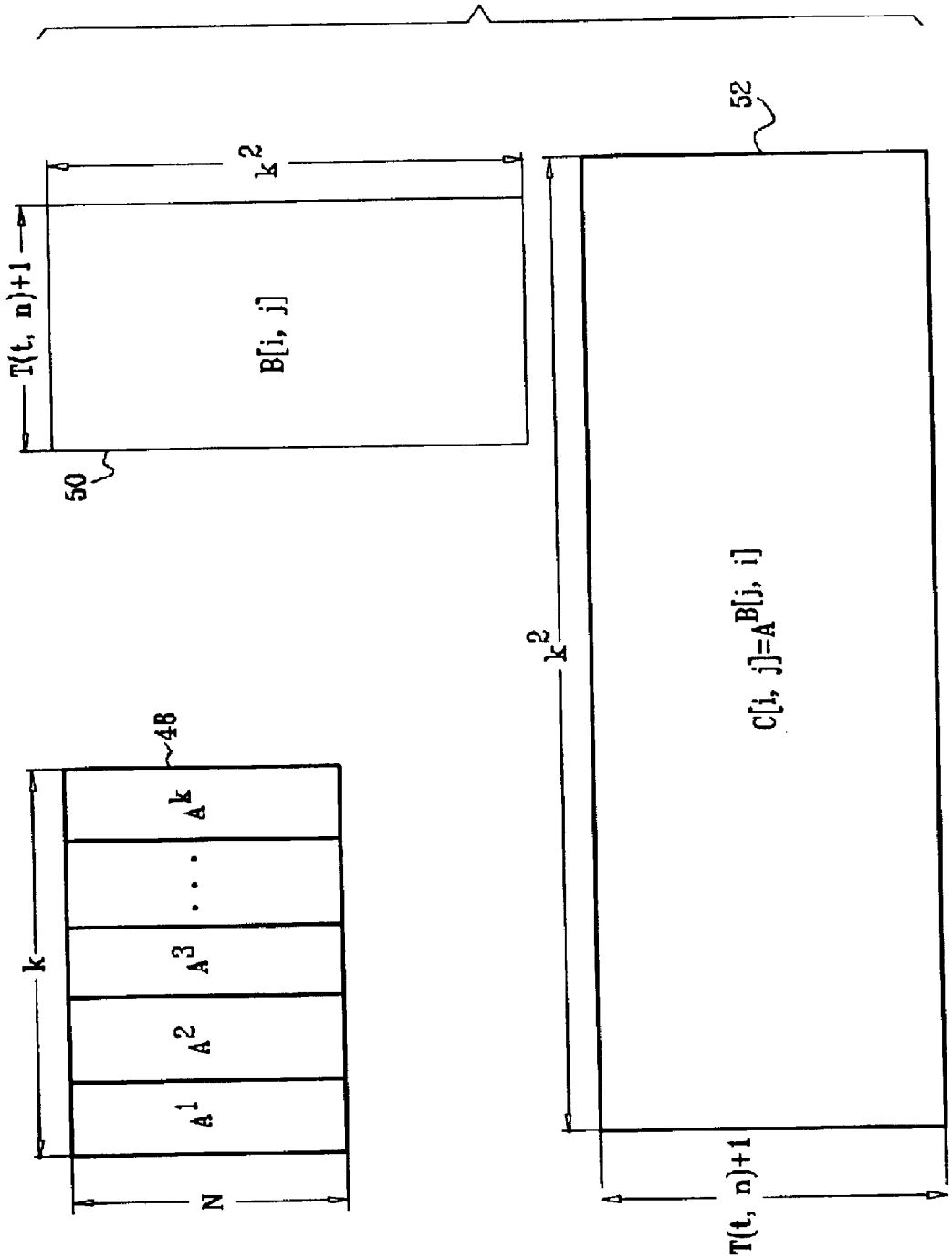
FIG. 3 is a block diagram relating to the proof of a mathematical theorem that deals with the existence of combinatorial covering designs based on the existence of mutually orthogonal Latin squares.

Proof: Reference is now made to FIG. 3, which is a block diagram relating to the proof of Theorem 10. Let an array A 48 be a t-wise covering test suite with k columns, N rows, entries from $I_n$, and let $A^i$ be the i-th column of the array A 48. Let an array B 50, B=B[i, j], be an orthogonal array of strength 2 with T(t, n)+1 columns and entries from $I_k$.

A block array C 52 with $k^2$ columns and T(t, n)+1 rows. Each element in the block array C 52 will be a column of the array A 48. Let $A^{B[j,i]}$ be the block in the i-th row and j-th column of the block array C 52.

Now consider T, an arbitrary t-tuple of members of $I_n$. Let C' be a submatrix of the block array C 52 induced by an arbitrary choice of t columns. It is desired to show that the t-tuple T is a row of the submatrix C'.

The columns of the submatrix C' correspond to t rows of the array B 50. Let B' be the submatrix of the array B 50 induced by those t rows. It is desired to find a column in the submatrix B' with distinct values, whenever the t-tuple T has distinct values in the corresponding coordinates, since this would guarantee that the row T is a row in the submatrix C' using the properties of the base array A 48.

Since the array B 50 is an orthogonal array, whenever B[i, j]=B[k, j], then B[i, m]≠B[k, m] for every column m≠i. This means that any pair of distinct values in the row T eliminates at most one column of the submatrix B'. By Turan's theorem, the number of pairs of distinct values in the t-tuple T is at most T(t, n), and hence at least one column in the submatrix B' contains distinct values whenever the t-tuple T contains distinct values. This completes the proof.

The construction given in the proof of Theorem 10 is the main tool used in the invention for general values of t greater than 2.

One more recursive result is presented, which shows how to double the number of columns in 3-wise and 4-wise covering suites. The result for t=3 and n=2 is known from the document "k-Propri□t□s Dans Les Tableaux De N Colonnes; Cas Particulier de la K-Surjectivit□ et de la k-Permutativit□", G. Roux, Ph.D. Dissertation, University of Paris 6, 1987, and are presented here in the interest of clarity. The result for t=3 appears in the publication On the state of strength 3 covering arrays, *J. Combinatorial Designs*, M. A. Chateauneuf and D. L. Kreher. To appear; (available on the Internet at www.math.mtu.edu/~kreher/). The proof given herein is different. The result presented herein for t=4 is believed to be new.

A tool used in the construction is a partition of the edge set of the complete directed graph on n vertices, such that each part contains a spanning set of directed cycles—i.e., each vertex occurs precisely once as the head of an arc and once as the tail of an arc. The simplest such partition is given by the following construction:

$$F_j = \{(i, i+j (\text{mod } n)) : i \in I_n\}, j=1, 2, \ldots, n-1.$$

Theorem 11: For all positive integers n and k, a) $CS_3(n^{2k}) \leq CS_3(n^k) + (n-1)CS_2(n^k)$ b) $CS_4(n^{2k}) \leq CS_4(n^k) + (n-1)CS_3(n^k) + CS_2((n^2-n)^k)$ Proof: a) Let A be a 3-wise covering suite with k columns and $CS_3(n^k)$ rows over the symbol set $I_n$. Construct a new array by taking each column of A twice and adding n−1) $CS_2(n^k)$ rows, constructed as follows. Let B be a pairwise covering suite with k columns and $CS_2(n^k)$ rows over the symbol set $I_n$. Take n−1 copies of B, and replace the i-th symbol in the j-th copy with the i-th member (an ordered pair) of $F_j$.

To verify that this construction yields a 3-wise covering suite, it is necessary to verify that three types of triples are covered by some row of the array, triples with three elements in distinct columns of the original array A, triples with two equal symbols in columns, which came from the same column of A, and triples with two unequal symbols in columns, which came from the same column in A. The first and second types of triples are covered due to the original structure of A, and the third type of triple is covered by the construction of the additional rows from B.

The construction and proof for b) is similar. Let A, B, and C be 4-wise, 3-wise, and pairwise covering suites with the parameters given in the statement of the result. Take each column of A twice, take n−1 copies of B and replace the i-th symbol in the j-th copy with the i-th member of $F_j$, then take a copy of C, and replace the i-th symbol with the i-th arc in arbitrary ordering of the arcs of the complete directed graph with vertex set $I_n$.

It has been determined by the inventors that the construction in the proof of Theorem 11 gives better practical results than Theorem 10 in the cases where t=3 or t=4.

According to a preferred embodiment of the invention, the operative algorithm consists of building a partial covering array using the results of Theorems 9, 10, and 11. Probabilistic constructions may also be performed, and the arrays are then completed using a heuristic algorithm, which is described in the following heuristics section.

Heuristics.

In this section it is disclosed how the techniques given in the previous sections can be used and extended by heuristic methods to solve practical problems in the generation of covering suites.

As discussed above, it is desirable to generate a minimal set of test cases guaranteeing t-wise coverage of k parameters with domains of sizes $n_1, n_2, \ldots, n_k$. The practical issues of limited time and space suggest the use of a polynomial time algorithm to solve this problem. It is known from the document *In-Parameter Order: A Test Generation Strategy for Pairwise Testing*, Y. Lei and K. C. Tai, in Proceedings of the 3rd IEEE High Assurance Systems Engineering Symposium, (1998) 254–161, that the determination of $CS_2(n^k)$ is NP-complete using a reduction to the vertex cover problem. It is also known from the document *Vector sets for exhaustive testing of logic circuits*, G. Seroussi and N. H. Bshouty, IEEE Trans. On Information Theory, 34 (1988) 513–522, that the determination of $CS_t(2^k)$ is NP-complete using a reduction to graph 3-coloring. Thus, it seems impractical to find a polynomial time algorithm for constructing minimal covering suites in the general case.

Another interesting and practical problem is that of finding a test suite with minimal deficiency given a fixed budget for executing at most N test cases. This problem is theoretically equivalent to the problem of finding a minimal test suite, so it too is NP-complete.

The technique disclosed in the above-noted Roux publication is particularly appropriate in the case of a fixed testing budget N. To apply the technique, k random sets of columns of length N are generated, with each symbol appearing either $\lfloor N/n_i \rfloor$ or $\lceil N/n_i \rceil$, times in the column. One column is then selected from each of these sets in such a way as to minimize the deficiency of the array that is generated. A greedy heuristic is used to do the minimization, since the selection of columns is reducible to the problem of finding a maximal clique in a graph.

Figure 4:
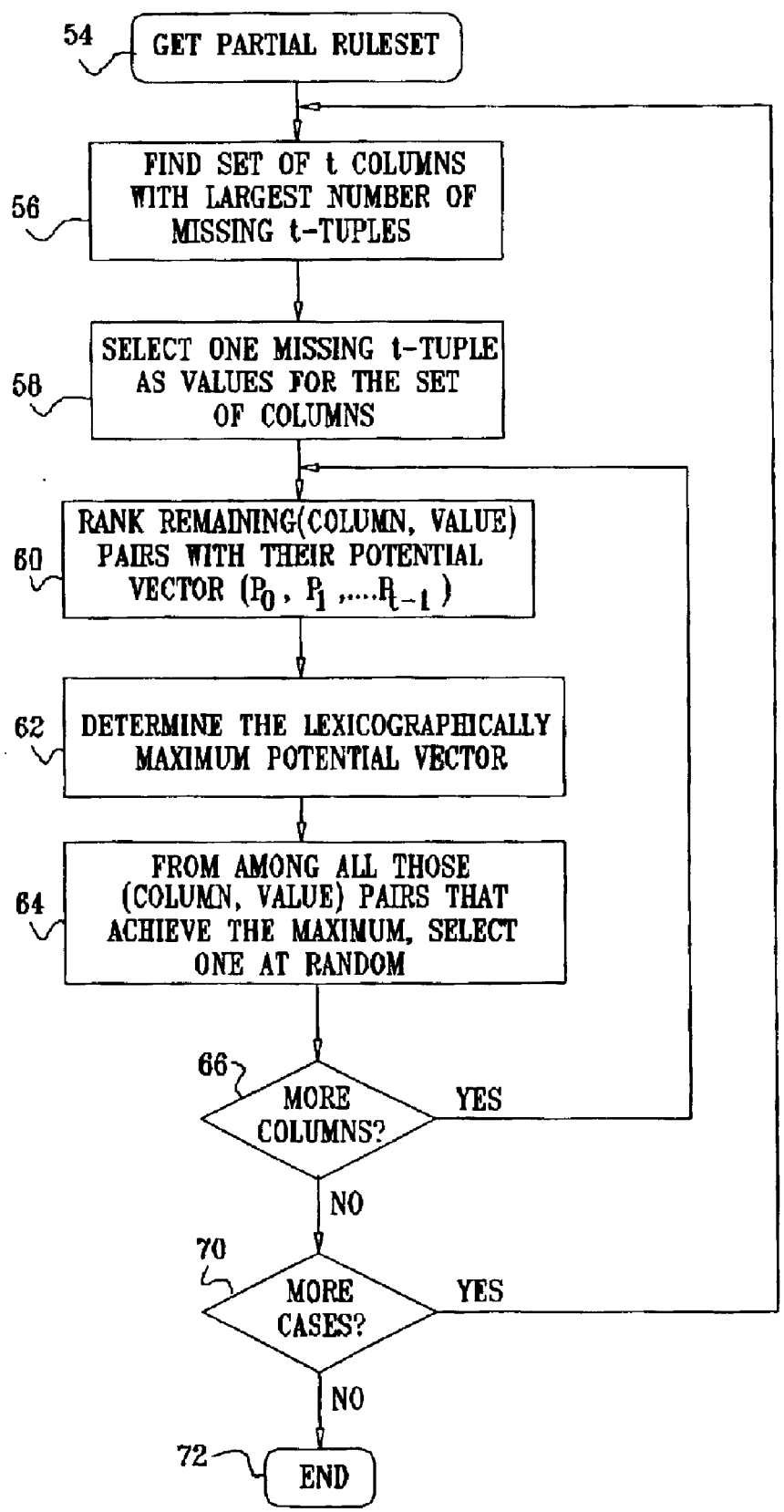
FIG. 4 is a flow diagram illustrating a heuristic method for the completion of a partial test suite in accordance with a preferred embodiment of the invention.

Reference is now made to FIG. 4, which is a flow diagram illustrating a heuristic method for the completion of a partial test suite in accordance with a preferred embodiment of the invention. The heuristic method can be performed repeatedly to generate a number of new test cases. It may be started from an empty set of test cases, and used on its own to construct a covering test suite, or it can be used after some initial test cases are generated using projective plane methods, or any other "starting" set of test cases—including test cases that are already in use by the testing organization. This is very useful since testers often have a great deal invested in existing test suites that later have to be expanded as the product under test is given more functionality or additional parameters.

The heuristic differs from that given in the above-noted Cohen et al. publication, *The AETG System: An Approach to Testing Based on Combinatorial Design*. In initial step 54, it is assumed that a partial test suite has been obtained, and it is required to add a new test case:

This is done in step 56 by first finding the set of t columns with the largest number of missing t-tuples, and in step 58 selecting one of the missing t-tuples as the values in those columns. Step 56 and step 58 are further illustrated below in Table 5 and Table 6 of Example 2.

Next, in step 60 all the remaining (column, value) pairs are then ranked by computing t values, $p_0, p_1, \ldots p_{t-1}$. The first of these values $p_0$ is the amount by which the inclusion of the said value in the said column in the partial test case would decrease the deficiency. That is the value $p_0$ counts the number of t-tuples containing the value in the column and t−1 other values that have already been fixed in the partial test case under construction. In general the value $p_i$ counts the total number of missing t-tuples containing that value in that column as well as t−1−i values that have already been fixed, and i undecided values in the other columns. In step 62 the (column, value) pair or pairs are identified, in which the value of the vector $(p_0, p_1, \ldots p_{t-1})$ is maximal, that is, the pair has the lexicographically largest potential vector.

Next, at step 64 a random selection is made among those (column, value) pairs that achieve the maximum value $(p_0, p_1, \ldots p_{t-1})$.

Control now proceeds to decision step 66, where a determination is made whether all the columns in the test case under construction have been evaluated. If not then control returns to step 60, and a further column, value pair is selected.

If at decision step 66 it is determined that all columns have been evaluated, then control passes to decision step 70, where it is determined whether the number of test cases required by the testing budget or program have been found. If the determination at decision step 70 is negative, then control returns to step 56.

If the determination at decision step 66 is affirmative, then control proceeds to final step 72, and the process terminates.

This procedure produces a practical, near-optimal result. Experimentally it has been shown that this algorithm produces test suites whose size grows asymptotically close to the lower bound of $n^t \log k$ for large values of k.

The method shown in FIG. 4 is illustrated for the case t=2 by the following example.

EXAMPLE 2

The process disclosed with reference to FIG. 4 is shown for the case t=2.

The members of column 1 come from domain D1 of size 2, its members are {0,1}.

The members of column 2 come from domain D2 of size 3, its members are {x,y,z}.

The members of column 3 come from domain D3 of size 4, its members are {a,b,c,d}.

The members of column 4 come from domain D4 of size 2, its members are {T, F}.

Five test cases are given:

TC1: 0 x a T
TC2: 0 y b F
TC3: 1 z c T
TC4: 1 z d T
TC5: 0 y c T

Now, to compute the next test case it will be noted that there are 6 D1,D2 pairs to be covered, of which 3 are already covered, namely the pairs 0x, 0y, and 1z. Thus, there are three uncovered pairs, namely the pairs 0z, 1x, 1z. To illustrate the situation, Table 5 is constructed as follows:

TABLE 5

| Column Pairs | 1&2 | | 1&3 | | 1&4 | | 2&3 | | 2&4 | | 3&4 | |
|---|---|---|---|---|---|---|---|---|---|---|---|---|
| Total number of pairs to be covered | 6 | | 8 | | 4 | | 12 | | 6 | | 8 | |
| Pairs covered so far by TC1–TC5 | 0x 1z | 0y | 0a 1c 0c | 0b 1d | 0T 1T | 0F | xa zc yc | yb zd | xT zT | yF yT | aT cT | bF dT |
| Pairs not yet covered | 0z 1z | 1x | 0d 1b | 1a | 1F | | Xb xd yd zb | xc ya za | xF | zF | aF cF | bT dF |
| Number of uncovered pairs | 3 | | 3 | | 1 | | 7 | | 2 | | 4 | |

The deficiency of this partial test suite is computed from the last row of Table 7:

3+3+1+7+2+4=18.

As in step 56 (FIG. 4), it is determined that columns 2 and 3 have the largest number of missing pairs. There are 7 missing pairs in the columns 2 and 3 taken together. One of these pairs is selected, as in step 58, say the pair xb. This reduces the deficiency to 17, and removes the pair xb from the list of deficient pairs.

Now, as in step 60, the remaining column value pairs are ranked to see how their addition to the partial test case "? x b ?" would decrease the deficiency. The ranking is shown in Table 6:

TABLE 6

| Column | Value | Deficient pairs | $p_0$ = num deficient pairs | Potential pairs | $p_1$ = num potential pairs |
|---|---|---|---|---|---|
| 1 | 0 | — | 0 | — | 0 |
| 1 | 1 | 1x 1b | 2 | 1F | 1 |
| 4 | T | BT | 1 | — | 0 |
| 4 | F | XF | 1 | 1F | 1 |

As disclosed in step 62, it is required to choose the pair (column 1, value 1), since this pair has the maximum value of $p_0$. Now the partial test case is "1 x b ?".

The deficiency has now been reduced to 15. The pairs 1x and 1b are removed from the list of deficient pairs.

It is now seen that there is still one column with a value to be determined, so the process of choosing a (column, value) pair is repeated. However, in this degenerate last case there is no choice of columns, and only the missing value can be chosen.

The $p_0$ value of (column 4, value T) is determined to be $p_0=1$ since bT is still a deficient pair, and the $p_0$ value for (column 4, value F) is $p_0=2$, since 1F and xF are both deficient at this stage. This completes the construction of the sixth test case as "1 x b F", and reduces the deficiency to 13.

Rulesets.

Referring again to FIG. 1, conventional techniques of test generation employ rulesets in the above-noted Murphi language of the form shown in the example of Ruleset 1:

Ruleset 1

Ruleset i:0..1;j:enum{A, B, C, D};k:1..2
Do
 Rule "Rule 1(int i, char j, int k)"
 ...
End;

Three parameters, i, j, and k, are passed by Ruleset 1 to the rule Rule1 therein. The parameter i is an integer that has two possible values. The parameter j has four possible values, and the parameter k has two possible values. The standard Murphi interpretation of a ruleset generates 2*4*2= 16 calls to the rule Rule1, one for each combination of the parameters i, j, and k, where the operator "*" represents multiplication.

An efficient implementation of the technique disclosed above has been accomplished by the introduction of several types of partial rule-sets for use by the test program generator engine 22. In the presently preferred embodiment, partial rulesets are implemented as extensions of the well-known Murphi language. A partial ruleset is an implementation of a ruleset, which only passes a subset of all possible choices of the parameters to the rule.

Table Driven Rulesets.

The most basic type of partial ruleset used in the test program generator engine 22 is the table driven ruleset, shown in the example of Ruleset 2. An input table has now been introduced into the ruleset, which specifies sets of input parameters for individual calls to the rule specified in the ruleset.

Ruleset 2

Ruleset i:0..1;j:enum{A, B, C, D};k:1..2
InputTable "Table ID"
0 A 1
1 B 2
0 C 2
1 D 1
EndInputTable
Do
 Rule "Rule 1(int i, char j, int k)"
 ...
End;

Ruleset 2 has the same parameter list as Ruleset 1. However, Ruleset 2 generates only four calls to the rule "Rule1", using the specific parameter sets given in the input table "Table ID".

Legal strings in the tables of table driven rulesets are values of the declared ruleset variables or the special character "*", which stands for all legal values of the relevant variable. Ruleset 3 generates the same 16 calls to the rule Rule1 as Ruleset 1, and in this sense, the two rulesets are equivalent.

| Ruleset 3 |
| --- |
| Ruleset i:0..1;j:enum{A, B, C, D};k:1..2<br>InputTable "Complete Ruleset"<br>* * *<br>EndInputTable<br>Do<br>    Rule "Rule 1(int i, char j, int k)"<br>. . .<br>End; |

In a further example, the input tables of Rulesets 4 and 5 are equivalent to one another.

| Ruleset 4 |
| --- |
| Ruleset i:0..1;j:enum{A, B, C, D};k:1..2<br>InputTable "Input Using Wildcard"<br>0 * 2<br>1 A *<br>EndInputTable |

| Ruleset 5 |
| --- |
| Ruleset i:0..1;j:enum{A, B, C, D};k:1..2<br>InputTable "Input Without Wildcard"<br>0 A 2<br>0 B 2<br>0 C 2<br>0 D 2<br>1 A 1<br>1 A 2<br>EndInputTable |

An enhancement to table driven rulesets permits an input table to be included in a separate file, or at a different place in the current input file, using the keyword "InputTableReference" as shown in Ruleset 6.

| Ruleset 6 |
| --- |
| Ruleset i:0..1;j:enum{A, B, C, D};k:1..2<br>InputTableReference "Input Without Wildcard" |

Inclusion of the input table by reference enables it to be used in more than one ruleset, and affords the convenience of storing the input table in a separate file. Identifiers of such included tables are required to be unique. Forward referencing of an included input table is currently required, so that the parser of the test program generator engine 22 (FIG. 1) can operate in one pass through the file.

Input and Input-Pair Coverage Rulesets.

To assist in the creation of interesting sets of inputs, two algorithms are provided for creating partial rulesets having a specified degree of input coverage. Both of these algorithms have a random aspect. One algorithm is embodied in a specialized partial ruleset, termed an "input coverage ruleset". The syntax for an input coverage ruleset is shown in the example of Ruleset 7

| Ruleset 7 |
| --- |
| Ruleset i:0..1;j:enum{A, B, C, D};k:1..2<br>InputCoverage <int><br>Do<br>    Rule "Rule1(int i, charj, int k)"<br>. . .<br>End; |

In response to the directive "InputCoverage", the test program generator engine 22 constructs an input table of minimal size, such that each input value occurs at least <int> times in the table, <int> being an optional parameter. If the parameter <int> is not given, it is assumed to be 1. This is in effect a covering array with t=1, when the parameter <int> is equal to 1.

Thus, if the parameter <int> is 1, an input table generated by the test program generator engine 22 could be the data shown in Table 7. Every legal value for each of the parameters i, j, and k occurs at least once.

| TABLE 7 |
| --- |
| 0 D 2 |
| 0 B 2 |
| 1 C 1 |
| 1 A 2 |

A second algorithm is embodied in another specialized partial ruleset, termed an input pair coverage ruleset. The syntax for an input pair coverage ruleset is shown in the example of Ruleset 8.

| Ruleset 8 |
| --- |
| Ruleset i:0..1;j:enum{A, B, C, D};k:1..2<br>InputPairCoverage <int><br>Do<br>    Rule "Rule1(int i, char j, int k)"<br>. . .<br>End; |

In response to the directive "InputPairCoverage", the test program generator engine 22 constructs an input table of close to minimal size, such that each pair of input values occurs at least <int> times in the table, <int> being an optional parameter. If the parameter <int> is not given, it is assumed to be 1. This is an example of a pairwise coverage array (t=2).

If the parameter <int> is 1, an input table generated by the test program generator engine 22 could be the data shown in Table 8. All pairs of the input values (i,j) occur once; all pairs of the input values (j,k) occur once; and all pairs of the input values (i,k) occur at least once.

| TABLE 8 | |
| --- | --- |
| 0 A 1 | 1 A 2 |
| 0 B 2 | 1 B 1 |
| 0 C 2 | 1 C 1 |
| 0 D 1 | 1 D 2 |

Random Test Generation.

Continuing to refer to FIG. 1, in one aspect of the invention, randomness is applied to the partial rulesets disclosed above. In one random mode of operation, the test program generator engine 22 simply generates tests randomly, applying a random number generator to the parameters of the rulesets. It is useful to operate in such a mode primarily during validation of the behavioral model 14 and the test execution infrastructure. The test program generator engine 22 generates a prescribed number of random tests, each containing a given maximum number of transitions.

In another random mode of operation the test program generator engine 22 chooses a rule to apply at random from among the enabled rules at any given state. It also chooses a random outcome from any rule that is applied. Different choices of a random seed generate different test suites.

Preferably, a rule is chosen at random from among all possible rules which cause a particular state transition.

Rule Coverage Test Generation.

Continuing to refer to FIG. 1, in a rule coverage mode of operation, the test program generator engine 22 builds a test suite, which is a sample list of parameters of all possible inputs for the test program. In the test suite, each enabled rule is invoked a specified number of times at each transition position in some test case in the test suite. In rule coverage mode of operation, a coverage task implies that during test generation the specified number of enabled rules at each transition is invoked. The specified number is termed the "coverage factor".

For example, if the behavioral model 14 has three rules which are enabled in all states, a possible test suite produced by the test program generator engine 22 executing in the rule coverage mode of operation could be the suite shown in Table 9.

TABLE 9

TestCase1: Rule1, Rule2, Rule3, Rule1
TestCase2: Rule2, Rule1, Rule1, Rule3

If an optional parameter <MAXTESTS> (greater than 2) had been specified, then one additional test would have been generated:

TestCase3: Rule3, Rule3, Rule2, Rule2.

Use of the parameter <MAXTESTS> ensures that each of the rules Rule1, Rule2, and Rule3 appears in each of four transitions of some test case in the suite. Preferably, the test program generator engine 22 is programmed to limit the number of tests generated to at most a value governed by an optional stop parameter <st>, which limits test generation, even if total rule coverage has not been achieved. Using the stop parameter, the test program generator engine 22 stops after <st> test cases have been generated, and issues a coverage statement to the effect that <st> of an estimated n coverage tasks are covered. Another aspect of the invention is rule coverage, which is a distinct application of the use of covering arrays in test case generation. In applying the inventive technique to rule coverage, a covering array of rules (t=1) is created along the length of the test case.

As test generation proceeds in the rule coverage mode of operation, the number of enabled rules in the $k^{th}$ transition may differ from one test case to another. The test program generator engine 22 estimates the maximum and minimum number of enabled rules at the $k^{th}$ transition, and stores these observations in two arrays, MinObservedEnabledRules[k], and MaxObservedEnabledRules[k] (k=1 . . . n), where n is the upper bound on the number of tests to be generated. Only estimates are stored, as the test program generator engine 22 does not perform an exhaustive traversal of the first n transitions, where n is the lower bound on the number of tests to be generated. The lower bound estimate on the number of rule coverage tasks is given by LowerBound=Product over all i of MinObservedEnabledRules [i].

The upper bound estimate is computed similarly using the parameter MaxObservedEnabledrules UpperBound=Product over all i of MaxObservedEnabledRules [i].

Rule Pair Coverage Test Generation.

Continuing to refer to FIG. 1, in a rule pair coverage mode of operation, the test program generator engine 22 builds a test suite, in which each pair of enabled rules is invoked a specified number of times at each pair of transition positions in some test case in the suite. In rule pair coverage mode of operation, a coverage task is the occurrence of an ordered pair of rules at two specified positions in the test case.

For example, if the behavioral model 14 has three rules which are enabled in all states, then a possible test suite produced by the test program generator engine 22 could be the suite shown in Table 10.

TABLE 10

TestCase1: Rule1, Rule1, Rule1, Rule1
TestCase2: Rule1, Rule2, Rule2, Rule2
TestCase3: Rule1, Rule3, Rule3, Rule3
TestCase4: Rule2, Rule1, Rule2, Rule3
TestCase5: Rule2, Rule2, Rule3, Rule1
TestCase6: Rule2, Rule3, Rule1, Rule2
TestCase7: Rule3, Rule1, Rule3, Rule2
TestCase8: Rule3, Rule2, Rule1, Rule3
TestCase9: Rule3, Rule3, Rule2, Rule1

In Table 10 it is ensured that each of the nine pairs (Rule1, Rule1), (Rule1, Rule2), . . . , (Rule3, Rule3) appear in each of the six transition pair positions of some test case in the suite. The transition pair positions are (1,2), (1,3), (1,4), (2,3), (2,4), (3,4).

Table 10 represents pairwise coverage of rules in a test case, and is a distinctly different way of using covering arrays in the generation of test cases as compared with input coverage. It is completely orthogonal to pairwise coverage of inputs to rulesets.

Preferably, the test program generator engine 22 is programmed to limit the number of tests generated to at most a value governed by an optional stop parameter <st>, which limits test generation, even if total rule coverage has not been achieved. Using the stop parameter, the test program generator engine 22 stops after <st> test cases have been generated, and issues a coverage statement to the effect that <st> of an estimated n coverage tasks are covered.

As test generation proceeds in the rule pair coverage mode of operation, the number of enabled rules in the $k^{th}$ transition may differ from one test case to another. The test program generator engine 22 estimates the maximum and minimum number of enabled rules at the $k^{th}$ transition and stores these observations in two arrays, MinObservedEnabledRules[k], and MaxObservedEnabledRules[k] (k=1 . . . n), where n is the upper bound on the number of tests to be generated. Only estimates are stored, as the test program generator engine 22 does not perform an exhaustive traversal of the first n transitions, where n is the lower bound on the number of tests to be generated. The lower bound estimate on the number of rule coverage tasks is given by LowerBound=Sum over all *i* less than *j*, and all *j*, of the product MinObservedEnabledRules[*i*]* MinObservedEnabledRules[*j*], where the operator "*" represents multiplication.

The upper bound estimate is computed similarly using the parameter MaxObservedEnabledrules.

UpperBound=Sum over all *i* less than *j*, and all *j*, of the product MaxObservedEnabledRules[*i*]*MaxObservedEnabledRules[*j*].

As discussed hereinabove, it is common in both the hardware and software domains to specify the behavior of a unit to be tested by a finite state machine. The states represent the possible states that a software unit can be in, e.g., the current screen on display, and the fields, and actions that are currently active or grayed out. The transitions between states are arcs labeled by the input stimulus from the user that cause the unit to change state. A great deal of research activity has been devoted to the analysis of these state machine models, but most of this effort is stymied by the so-called state explosion problem. The size of the state machine grows exponentially even when the unit under test has a relatively simple structure. The techniques which have been disclosed herein greatly ameliorate the problem of state explosion.

Further Applications and Examples.

EXAMPLE 3

An add-on to the Murϕ model checker which is disclosed in the document D. Dill, *Murϕ Description Language and Verifier*, available on the Internet (sprout.stanford.edu/dill/murphi.html). The add-on uses covering suites rather than the Cartesian product of all possible inputs to describe the sets of possible stimuli to the unit under test. This reduces the number of arcs leaving any given state, and has been shown in practice to reduce the size of the state space considerably. The software is now no longer an exhaustive model checker—since it does not consider the complete range of possible behavior, but it remains useful as an under-approximation model of the software that can be used for test case generation. A test case in this context is a sequence of stimuli to be applied to the unit under test, or equivalently a directed path in the state machine model.

EXAMPLE 4

An example involving robotics, in which a species of robots known as blind dyslectic synchronized robots, involves the minimax rendezvous time problem for k distinguishable robots on a line. The robots are initially placed at the points 1, 2, . . . , k in some permutation. The robots are dyslectic in the sense that they do not have a common notion of the positive direction on the line. The robots cannot see each other and they only become aware of each other's presence by the sense of touch. The minimax rendezvous time is the minimum over all strategies of the maximum over all possible starting configurations of the time by which they can all get together. All the robots have the same maximum speed and are synchronized to start their rendezvous strategy together.

In the document *Rendezvous Search on a Line*, S. Gal, Operations Research 47 (1999), 974–976, a strategy is proposed, where, in a first phase, the robots at positions 1 and k identify the fact that they are at extreme positions, and then, in a second phase proceed towards the center, gathering all their colleagues, who remain passive in the second phase. Example 4 is a variant of Gal's algorithm, which guarantees that the first phase is as short as possible.

Each robot is provided with a binary sequence of length $N=CS_2(2^k)$. The sequence for the k-th robot is the k-th column of an optimal covering suite as disclosed hereinabove. The robot interprets a 0 as an instruction to move half a unit to its left, then half a unit right; a 1 is interpreted as a move half right then half left. Since the robots do not have a common sense of direction, in order to guarantee that each internal robot meets both its neighbors, the pair of robots must execute the four patterns 00, 01, 10, and 11. After precisely N time units, all the internal robots have met both their neighbors, and thus the extremal robots can be sure that they are on the ends, and begin the second phase.

It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art which would occur to persons skilled in the art upon reading the foregoing description.

What is claimed is:

1. A method of verifying a design, comprising the steps of:
modeling a behavior of said design as a finite state machine;
generating a test program based on said finite state machine; and
preparing a suite of test cases as an input for said test program, wherein said test cases comprise at least one command, said command having a plurality of parameters, said parameters being selected from a predetermined set of values, said parameters applying to transitions of said finite state machine, and having a predetermined level of mutual interactions, wherein said test cases are minimized to a near-optimal minimal plurality that includes at least one instance of each of said mutual interactions at said predetermined level.

2. A method of verifying a design, comprising the steps of:
modeling a behavior of said design as a finite state machine;
generating a test program based on said finite state machine; and
preparing a suite of test cases as an input for said test program, wherein said test eases comprise at least one command, said command having a plurality of parameters, said parameters having a predetermined level of mutual interactions, wherein said test cases are minimized to a near-optimal minimal plurality that includes at least one instance of each of said mutual interactions at said predetermined level, wherein said step of preparing a suite of test cases is performed by:
defining relationships among said parameters as a plurality of t-tuples of values of said parameters;
preparing a table of input sets, said table having a plurality of columns, each of said columns comprising a portion of said values;
finding a partial test case comprising a set of t columns, wherein a deficiency comprising missing ones of said t-tuples is maximal;
assigning one of said missing t-tuples as said values for said set of t columns;
entering possible values of said missing t-tuples in others of said columns;

ranking said other columns and said values thereof according to a reduction of said deficiency that is produced by inclusion in said partial test case of respective ones of said other columns; and selecting one of said other columns and said values thereof having a highest rank in said step of ranking, and including a value of said selected column in said input set.

3. The method according to claim 2, wherein said steps of finding and selecting are performed repetitively.

4. The method according to claim 2, wherein said step of ranking comprises:

for a ranked column entering a value x therein;

computing a value $p_0$ that represents an immediate decrease of said deficiency ; and computing a sequence of values $p_1, p_2, \ldots, p_i, \ldots, p_{t-1}, \ldots$, that represents a potential number of said missing t-tuples having said value x in said ranked column, and i undecided values in said other columns.

5. The method according to claim 2, wherein said step of preparing a suite of test cases is performed by:

preparing additional tables of input sets, each of said additional tables of input sets corresponding to one of said relationships; and combining said table and said additional tables of input sets into a single table of test cases.

6. The method according to claim 5, wherein said step of preparing a suite of test cases further comprises including said table and said additional tables of input sets in corresponding partial rulesets.

7. The method according to claim 6, wherein said suite of test cases includes a predetermined number of invocations of a rule of each of said partial rulesets at each transition position of at least one of said test cases.

8. The method according to claim 6, wherein said suite of test cases includes a predetermined number of invocations of rules of each pair of said partial rulesets at each transition position of at least one of said test cases.

9. The method according to claim 6, wherein said partial rulesets comprise an input table and rules having declared variables, wherein said input table comprises values of said variables and a special character that represents all legal values of a corresponding one of said variables.

10. A computer software product, comprising a computer-readable medium in which computer program instructions are stored, which instructions, when read by a computer, cause the computer to execute method of verifying a design, comprising the steps of:

loading a behavior model of said design as a finite state machine;

generating a test program based on said finite state machine; and preparing a sample of all possible inputs for said test program, wherein said sample comprise a list of parameters, said parameters being selected from a predetermined set of values, said parameters applying to transitions of said finite state machine, and having predetermined mutual interactions, wherein said sample is minimized to a near-optimal minimal plurality of said inputs that cover at least one instance of each said interactions.

11. A computer software product, comprising a computer-readable medium in which computer program instructions are stored, which instructions, when read by a computer, cause the computer to execute method of verifying a design, comprising the steps of:

loading a behavior model of said design as a finite state machine;

generating a test program based on said finite state machine; and preparing a sample of all possible inputs for said test program, wherein said sample comprise a list of parameters, said parameters having predetermined mutual interactions, wherein said sample is minimized to a near-optimal minimal plurality of said inputs, that cover at least one instance of each said interactions, wherein said step of preparing a sample is performed by:

defining relationships among said inputs as a plurality of t-tuples of values of said inputs;

preparing a table of input sets, said table having a plurality of columns, each of said columns comprising a portion of said values;

finding a partial test case comprising a set of t columns, wherein a deficiency comprising missing ones of said t-tuples is maximal;

assigning one of said missing t-tuples as said values for said set of t columns;

ranking others of said columns and said values entered therein according to a reduction of said deficiency that is produced by inclusion in said partial test case of respective ones of said other columns; and selecting one of said other columns and said values entered therein having a highest rank in said step of ranking.

12. The computer software product according to claim 11, wherein said step of ranking comprises for a ranked column and a value x entered therein, computing a first value that represents a decrease of said deficiency and computing a second value that represents a potential number of said missing t-tuples having said value x in said ranked column and undetermined values in said other columns.

13. A computer software product, comprising a computer-readable medium in which computer program instructions are stored, which instructions, when read by a computer, cause the computer to execute method of verifying a design, comprising the steps of:

loading a behavior model of said design as a finite state machine;

generating a test program based on said finite state machine; and preparing a sample of all possible inputs for said test program, wherein said sample comprise a list of parameters, said parameters having predetermined mutual interactions, wherein said sample is minimized to a near-optimal minimal plurality of said inputs that cover at least one instance of each said interactions, wherein said step of preparing is performed by:

defining relationships among said parameters; and constructing tables of input sets, each of said tables of input sets corresponding to one of said relationships.

14. The computer software product according to claim 13, wherein said step of preparing further comprises including said tables of input sets in corresponding partial rulesets.

15. The computer software product according to claim 14, wherein at least one of said partial rulesets is a table driven ruleset.

16. The computer software product according to claim 14, wherein at least one of said partial rulesets is an input coverage ruleset, wherein a level of said interactions is 1.

17. The computer software product according to claim 14, wherein at least one of said partial rulesets is an input pair coverage ruleset, wherein a level of said interactions is 2.

18. The computer software product according to claim 14, wherein at least one of said tables of input sets is included by reference in said partial rulesets.

19. The computer software product according to claim 14, wherein said sample includes a predetermined number of invocations of a rule of each of said partial rulesets at each transition position of at least one test case of said sample.

20. The computer software product according to claim 14, wherein said sample includes a predetermined number of invocations of rules of each pair of said partial rulesets at each transition position of at least one test case of said sample.

21. The computer software product according to claim 14, wherein said partial rulesets comprise an input table and rules having declared variables, wherein said input table comprises values of said variables and a special character that represents all legal values of a corresponding one of said variables.

22. A verification system, comprising:
   a memory having a behavioral model of a design residing therein, said behavioral model comprising a finite state machine; and
   a test generator for generating a test program according to said behavioral model, said test generator being adapted to prepare a set of sample inputs for said test program, wherein said inputs comprise a plurality of parameters, said parameters being selected from a predetermined set of values, said parameters applying to transitions of said finite state machine, and having a predetermined level of mutual interactions, wherein said set has substantially a minimal plurality of said inputs that include at least one instance of each of said interactions.

23. The verification system according to claim 22, further comprising:
   an execution engine for executing said test program on a system-under-test; and
   a validation engine for evaluating a response of said system-under-test to said test program.

24. The verification system according to claim 23, wherein said set comprises a table of said inputs, wherein said table is included in a partial ruleset.

25. The verification system according to claim 24, wherein said set corresponds to a predetermined number of invocations of a rule of said partial ruleset at each transition position of at least one test case in said set.

26. The verification system according to claim 24, wherein said partial ruleset comprises a plurality of partial rulesets, and said set corresponds to a predetermined number of invocations of rules of each pair of rules in said partial rulesets at each transition position of at least one test case of said set.

27. A computer software products comprising a computer-readable medium in which computer program instructions are stored, which instructions, when read by said computer, cause said computer to execute a method of testing a design, comprising the steps of:
   defining a finite state machine as a behavior model of a system-under-test having transitions between states thereof;
   providing a partial ruleset comprising a rule and a parameter list thereof, and an input table having at least one set of parameters corresponding to members of said parameter list; and
   responsive to said partial ruleset, generating a test program for said system-under-test, wherein said rule of said partial ruleset is invoked at one of said transitions of said finite state machine using said set of parameters in said parameter list.

28. A verification system, comprising:
   a memory having a behavioral model of a system-under-test residing therein, wherein said behavioral model is a finite state machine having transitions between states thereof; and
   a test program generator responsive to said behavioral model for generating a test program for said system-under-test, said test program generator being adapted to a programming language comprising a partial ruleset having a rule, a parameter list in said rule, and an input table having at least one input set of parameters corresponding to said parameter list, wherein in said test program said rule is invoked at one of said transitions using said input set of parameters.

* * * * *